(12) United States Patent
Kim

(10) Patent No.: US 7,994,520 B2
(45) Date of Patent: Aug. 9, 2011

(54) SEMICONDUCTOR LIGHT EMITTING DEVICE HAVING MULTIPLE SINGLE CRYSTALLINE BUFFER LAYERS

(75) Inventor: Kyong Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/277,170

(22) Filed: Nov. 24, 2008

(65) Prior Publication Data
US 2009/0140267 A1    Jun. 4, 2009

(30) Foreign Application Priority Data
Nov. 26, 2007  (KR) .................. 10-2007-0120650

(51) Int. Cl.
*H01L 27/15* (2006.01)
*H01L 33/12* (2010.01)

(52) U.S. Cl. ..... 257/86; 257/94; 257/190; 257/E33.001; 257/E21.023; 438/36

(58) Field of Classification Search ............. 257/79–103
See application file for complete search history.

(56) References Cited

U.S. PATENT DOCUMENTS

| 2006/0138448 | A1* | 6/2006 | Komiyama et al. | 257/103 |
| 2007/0120142 | A1* | 5/2007 | Son | 257/103 |
| 2009/0114942 | A1* | 5/2009 | Yokoyama et al. | 257/103 |

* cited by examiner

*Primary Examiner* — Marcos D Pizarro
*Assistant Examiner* — Raj Gupta
(74) *Attorney, Agent, or Firm* — Birch, Stewart, Kolasch & Birch, LLP

(57) ABSTRACT

Disclosed are a semiconductor light emitting device comprising a single crystalline buffer layer and a manufacturing method thereof. The semiconductor light emitting device comprises a single crystalline buffer layer, and a compound semiconductor structure comprising III and V group elements on the single crystalline buffer layer.

11 Claims, 10 Drawing Sheets

SEMICONDUCTOR LIGHT EMITTING DEVICE HAVING MULTIPLE SINGLE CRYSTALLINE BUFFER LAYERS The present application claims priority under 35 U.S.C, §119 to Korean Patent Application No. 10-2007-0120650 (filed on Nov. 26, 2007), which is hereby incorporated by reference in its entirety.

BACKGROUND

The present disclosure relates to a semiconductor light emitting device and a manufacturing method thereof.

Groups III-V nitride semiconductors have been variously applied to an optical device such as blue and green light emitting diodes (LEDs), a high speed switching device, such as a metal semiconductor field effect transistor (MOSFET) and a hetero junction field effect transistor (HFET), and a light source of a lighting device or a display device.

The nitride semiconductor is mainly used for an LED or a laser diode (LD), and studies have been continuously conducted to improve the manufacturing process or light efficiency of the nitride semiconductor.

SUMMARY

The embodiment provides a semiconductor light emitting device comprising a single crystalline buffer layer and a manufacturing method thereof.

An embodiment provides a semiconductor light emitting device comprising: a single crystalline buffer layer, and a compound semiconductor structure comprising III and V group elements on the single crystalline buffer layer.

An embodiment provides a semiconductor light emitting device comprising: a light emitting structure comprising a first conductive semiconductor layer, an active layer on the first conductive semiconductor layer, and a second conductive semiconductor layer on the active layer; a single crystalline buffer layer formed in at least one of an interior, an upper portion and a lower portion of one layer of the light emitting structure.

An embodiment provides a method for manufacturing a semiconductor light emitting device comprising: forming a single crystalline buffer layer comprising a composition equation of $Al_Y(Ga_xIn_{1-x})N$ ($X \leq 1$, $Y \leq 1$) on a substrate, and forming a light emitting structure on the single crystalline buffer layer.

DETAILED DESCRIPTION OF THE EMBODIMENTS

Figure 1:
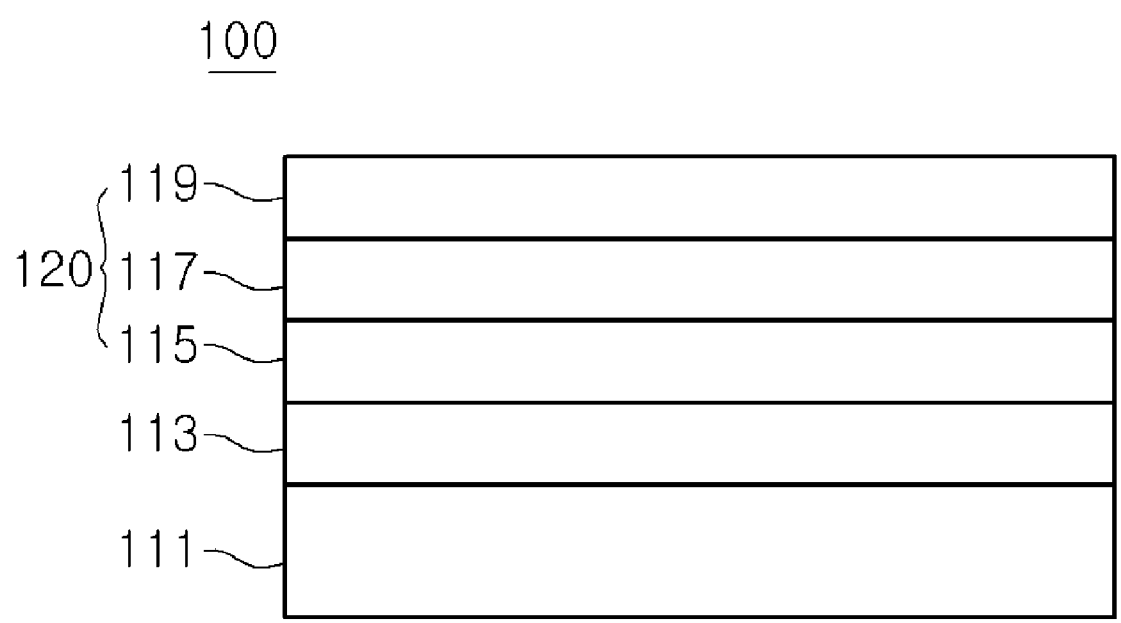
FIG. 1 is a side sectional view showing a semiconductor light emitting device according to an embodiment.

Hereinafter, a semiconductor light emitting device and a manufacturing method thereof according to an embodiment will be described with reference to the accompanying drawings. In the description of the embodiment, the term "on" or "under" of each layer will be described with reference to the accompanying drawings and thickness of each layer is not limited to thickness shown in the drawings.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

FIG. 1 is a side sectional view showing a semiconductor light emitting device according to the embodiment.

Referring to FIG. 1, the semiconductor light emitting device comprises a substrate 111, a single crystalline buffer layer 113 and a light emitting structure 120.

The substrate 111 may comprise materials selected from the group consisting of $Al_2O_3$, GaN, SiC, ZnO, Si, GaP, InP and GaAs, and may also be removed after the light emitting structure 120 is generated.

The single crystalline buffer layer 113 is formed on the substrate 111. The buffer layer 113 may comprise compound semiconductors obtained by combining III and V group elements with each other. For example, the buffer layer 113 comprises materials selected from the group consisting of GaN (comprises β-GaN), InN (comprises β-InN), AlN (comprises β-AlN), InGaN, AlGaN, InAlGaN and AlInN that satisfy a composition equation of $Al_Y(Ga_xIn_{1-x})N$ ($0 \leq X, Y \leq 1$). The elements of the buffer layer 113 can be combined through binary, ternary or quaternary combination.

The buffer layer 113 may comprise dopants of a II group element (e.g. Mg) and a IV group element (e.g. Si). The amount of the II group element corresponds to 0.1% to 9% of the amount of the III group element. The amount of the IV group element corresponds to 0.1% to 10% of the amount of the III group element.

The buffer layer 113 is grown as a single crystalline epitaxial layer by changing the temperature from the low temperature of 500° C. to 800° C. to the high temperature of 800° C. to 1500° C. and growth atmosphere from $H_2$ atmosphere to $N_2$ atmosphere. The buffer layer 113 may be grown as a single crystalline thin film by maintaining the temperature in the range of 500° C. to 1500° C. using in-situ equipment. At this time, the buffer layer 113 may selectively use materials having a bandgap of 0.1 eV to 6.5 eV and a lattice constant of 2 Å to 6 Å.

The buffer layer 113 may have thickness of 500 Å to 10000 Å, resistance of $1\times10^7$ to $1\times10^{-4}$ Ωcm and carrier concentration of $5\times10^{15}/cm^3$ to $3\times10^{21}/cm^3$. The buffer layer 113 may have one of hexagonal, wurtzite, zincbland and cubic crystalline structures.

The buffer layer 113 may have a multilayer structure. At this time, the buffer layer 113 may have the same crystalline structure or crystalline structures different from each other. In detail, when the buffer layer 113 has a hetero-structure with at least two layers, the layers have crystalline structures different from each other so that strain applied to the layers can be minimized. A lower buffer layer on the substrate 111 may have a composition equation of $Al_Y(Ga_xIn_{1-x})N(0 \leq X, Y \leq 1)$ and one of the hexagonal, wurtzite, zincbland and cubic structures. Further, an upper buffer layer on the lower buffer may have a composition equation of $Al_{Y1}(Ga_{x1}In_{1-x1})N(0 \leq X1, Y1 \leq 1)$ and one of the hexagonal, wurtzite, zincbland and cubic structures.

The buffer layer 113 according to the embodiment can prevent strain caused by difference in lattice constants and thermal expansion coefficients between the substrate 111 and the epitaxial layer and can serve as a buffering layer capable of preventing degradation of wetting property relative to the substrate 111.

An undoped semiconductor layer (not shown) may be formed on the buffer layer 113. The undoped semiconductor layer can be prepared in the form of an undoped GaN layer.

The light emitting structure 120 is formed on the buffer layer 113. The light emitting structure 120 comprises a first conductive semiconductor layer 115, an active layer 117 and a second conductive semiconductor layer 119. In the light emitting structure 120, the semiconductor layer can be changed or another semiconductor layer can be added within the technical scope of the embodiment. Further, the light emitting structure 120 is not limited to a stack structure of such elements.

The first conductive semiconductor layer 115 is formed on the buffer layer 113 and may comprise material having a composition equation of $In_xAl_yGa_{1-x-y}N$ ($0 \leq x \leq 1$, $0 \leq y \leq 1$, $0 \leq x+y \leq 1$). For example, the first conductive semiconductor layer 115 may comprise materials selected from the group consisting of CaN, InN, AlN, InGaN, AlGaN, InAlGaN and AlInN that represent a combination of III and V group elements, and may be doped with a first conductive dopant. When the first conductive semiconductor layer 115 is an N type semiconductor layer, the first conductive dopant may comprise an N type dopant such as Si, Ge and Sn.

The active layer 117 is formed on the first conductive semiconductor layer 115. The active layer 117 has a single quantum well structure or a multi-quantum well structure. For example, the active layer 117 can be formed by laminating InGaN and GaN, or AlGaN and GaN. The active layer 117 comprises material having a bandgap energy according to wavelength of emitted light. For example, in the case of blue light having wavelength of 460 nm to 470 nm, the active layer 117 may have a single quantum well structure or a multi-quantum well structure at one cycle of InGaN well layer and a CaN barrier layer. The well layer may have a composition equation of $InGa_{(1-x)}N(0 \leq x \leq 1)$. The active layer 117 may comprise materials that emit chromatic light such as blue light, red light and green light.

A conductive clad layer (not shown) may also be formed on and/or under the active layer 117. The conductive clad layer can be prepared in the form of an AlGaN layer.

The second conductive semiconductor layer 119 is formed on the active layer 117. The second conductive semiconductor layer 119 may comprise a semiconductor layer doped with a second conductive dopant. For example, the second conductive semiconductor layer 119 may comprise materials selected from the group consisting of GaN, InN, AlN, InGaN, AlGaN, InAlGaN and AlInN. When the second conductive semiconductor layer 119 is a P type semiconductor layer, the second conductive semiconductor layer 119 can be doped with a P type dopant such as Mg, Zn, Ca, Sr and Ba.

A third conductive semiconductor layer and/or a transparent electrode layer can be formed on the second conductive semiconductor layer 119. Such elements can be easily changed or added within the technical scope of the embodiment. The third conductive semiconductor layer can be prepared in the form of an N type semiconductor layer. The light emitting structure 120 has been described in relation to a compound semiconductor light emitting device having an N—P junction structure. However, the scope of the present invention is not limited thereto. In detail, the light emitting structure 120 may have an N—P—N junction structure, a P—N junction structure or a P—N—P junction structure.

The buffer layer 113 can be formed under, on or in the first conductive semiconductor layer 115. Further, the buffer layer 113 can be formed on and/or tinder the active layer, or under or in the second conductive semiconductor layer 119. In addition, the buffer layer 113 can be formed on and/or under another undoped semiconductor layer.

Figure 2:
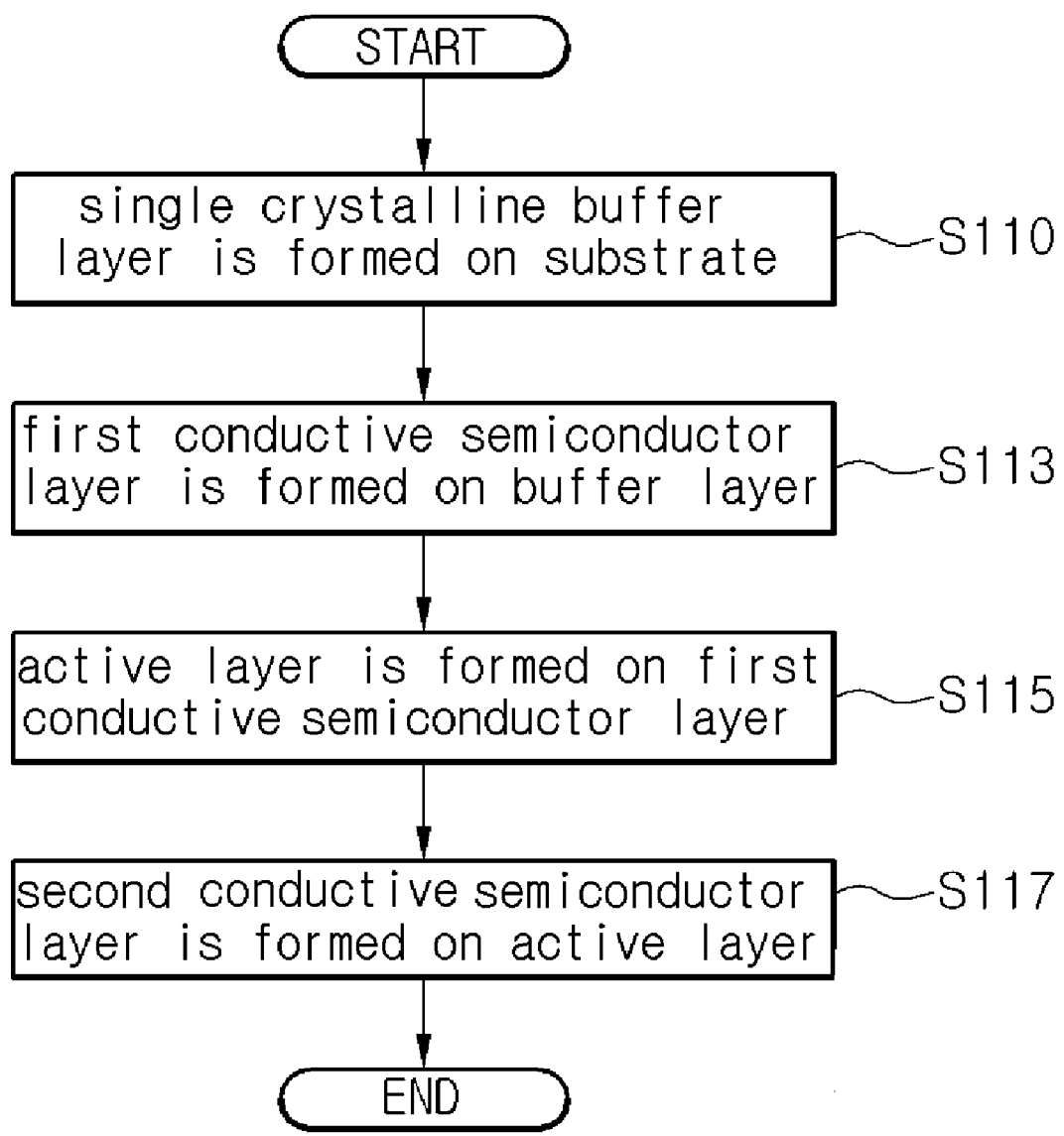
FIG. 2 is a flow diagram showing a manufacturing process of a semiconductor light emitting device according to an embodiment.

FIG. 2 is a flow diagram showing a manufacturing process of the semiconductor light emitting device according to the embodiment.

Referring to FIG. 2, the single crystalline buffer layer is formed on the substrate (S110), the first conductive semiconductor layer is formed on the single crystalline buffer layer (S113), the active layer is formed on the first conductive semiconductor layer (S115), and the second conductive semiconductor layer is formed on the active layer (S117).

Nitride semiconductor is grown on the substrate using growth equipment such as E-beam deposition equipment, PYD (physical vapor deposition) equipment, CVD (chemical vapor deposition) equipment, PLD (plasma laser deposition) equipment, a dual-type thermal evaporator, sputtering equipment and MOCVD (metal organic chemical vapor deposition) equipment. However, the scope of the present invention is not limited thereto.

After the buffer layer is formed on the substrate, the semiconductor structure on the buffer layer can be formed through the above process or a process comprising an additional semiconductor layer. However, the scope of the present invention is not limited thereto.

Figure 3:
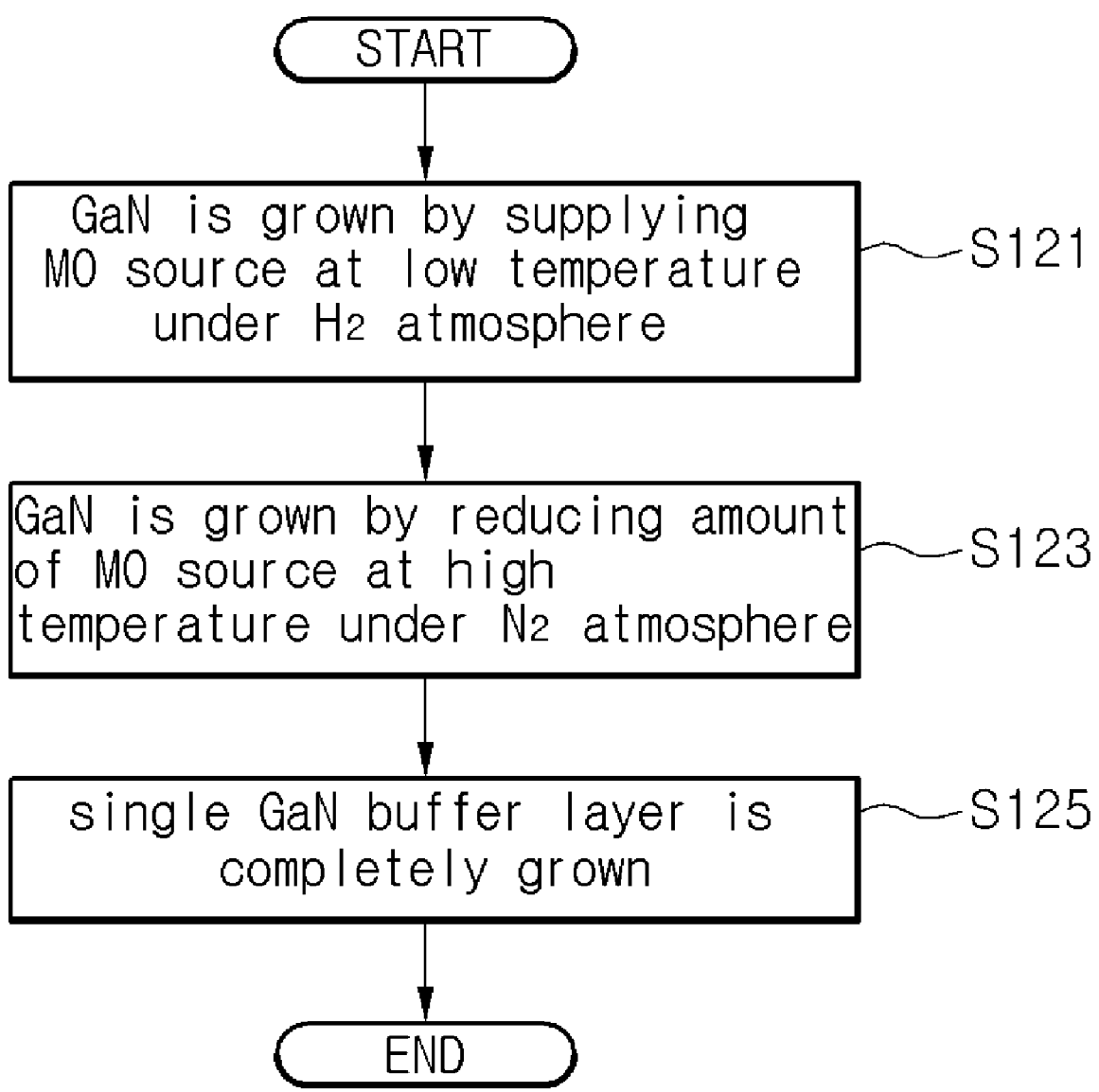
FIG. 3 is a flow diagram showing a process of forming a single crystalline buffer layer in FIG. 2.

FIG. 3 is a flow diagram showing a process of forming the single crystalline buffer layer in FIG. 2.

Referring to FIGS. 1 and 3, the buffer layer 113, for example, can be grown using MOCVD equipment that provides the growth temperature of 500° C. to 1500° C. and continuously supplies MO (metal organic) source.

When the buffer layer 113 is a GaN layer, the buffer layer 113 is grown while $NH_3$ and TMGa (trimethylgallium) or TEGa (triethylgallium) is being supplied. The TMGa or the TEGa, which serves as the MO source, is used as Ga source, and ammonia is used as N source. According to the embodiment, the buffer layer can also be formed using another deposition method such as an MBE or a HVPE in addition to an MOCVD. However, the scope of the present invention is not limited thereto.

In the initial stage, the buffer layer 113 is grown in the $H_2$ atmosphere by supplying hydrogen ($H_2$) at the low growth temperature of 500° C. to 800° C. (S121). If the buffer layer 113 has predetermined thickness, a growth mode is changed into the latter stage of growth.

The growth mode can be changed when the buffer layer 113 has growth thickness of 300 Å to 800 Å. Further, the growth mode can be changed according to the surface state of a thin film of the buffer layer 113.

In the latter stage of growth for the buffer layer 113, the buffer layer 113 is grown at the high growth temperature of 800° C. to 1500° C. under the $N_2$ atmosphere (S123). In detail, the growth temperature of the buffer layer 113 is increased from the lower temperature of 800° C. or less to the high temperature of 800° C. or more, and the growth atmosphere thereof is changed from the $H_2$ atmosphere to the $N_2$ atmosphere.

The reason for changing the growth atmosphere of the buffer layer 113 is as follows. When the thin film of the buffer layer 113 has thin growth thickness (e.g. about 0.1 nm to 30 nm), if the buffer layer 113 is continuously grown under the $H_2$ atmosphere, the surface of the thin film of the buffer layer 113 may be subject to desorption. In order to prevent such a problem, the growth atmosphere of the buffer layer 113 is changed from the $H_2$ atmosphere to the $N_2$ atmosphere.

If the growth atmosphere of the buffer layer 113 is changed, the amount of the MO source is reduced at the time point at which the growth atmosphere is changed from the $H_2$ atmosphere to the $N_2$ atmosphere. For example, the amount of the MO source can be reduced by 1% to 50% as compared with the amount (i.e. an initial value) of the MO source in the low temperature growth mode. The amount of the MO source is reduced at the time point at which the growth atmosphere of the buffer layer 113 is changed, so that a non-single crystalline thin film can be prevented from being grown. If the amount of the MO source is not reduced, the thin film of the buffer layer 113 may be grown as the non-single crystalline thin film due to three-dimensional growth.

Further, if the growth atmosphere of the buffer layer 113 is changed, the amount of the ammonia is reduced at the time point at which the growth atmosphere is changed. The amount of the ammonia can be reduced by 30% to 70% as compared with the amount (i.e. an initial value) of the ammonia in the low temperature growth mode.

The buffer layer 113 is grown in a two-dimensional growth mode until the buffer layer 113 has thickness of about 10 Å to 300 Å. Then, the buffer layer 113 is grown in the two-dimensional growth mode and a weak three-dimensional growth mode. If the high temperature growth mode is ended in the above manner, the single crystalline GaN buffer layer 113 is completed (S125). The buffer layer 113 can be formed with thickness of about 500 Å to 10000 Å and may have one of hexagonal, wurtzite, zincbland and cubic crystalline structures.

The buffer layer 113 comprises semiconductors selected from GaN (comprises β-GaN), InN (comprises β-InN), AlN (comprises β-AlN), InGaN, AlGaN, InAlGaN and AlInN that represent a combination of III and V group elements. The buffer layer 113 can be formed on the substrate, another undoped semiconductor layer or another conductive semiconductor layer.

Figure 4:
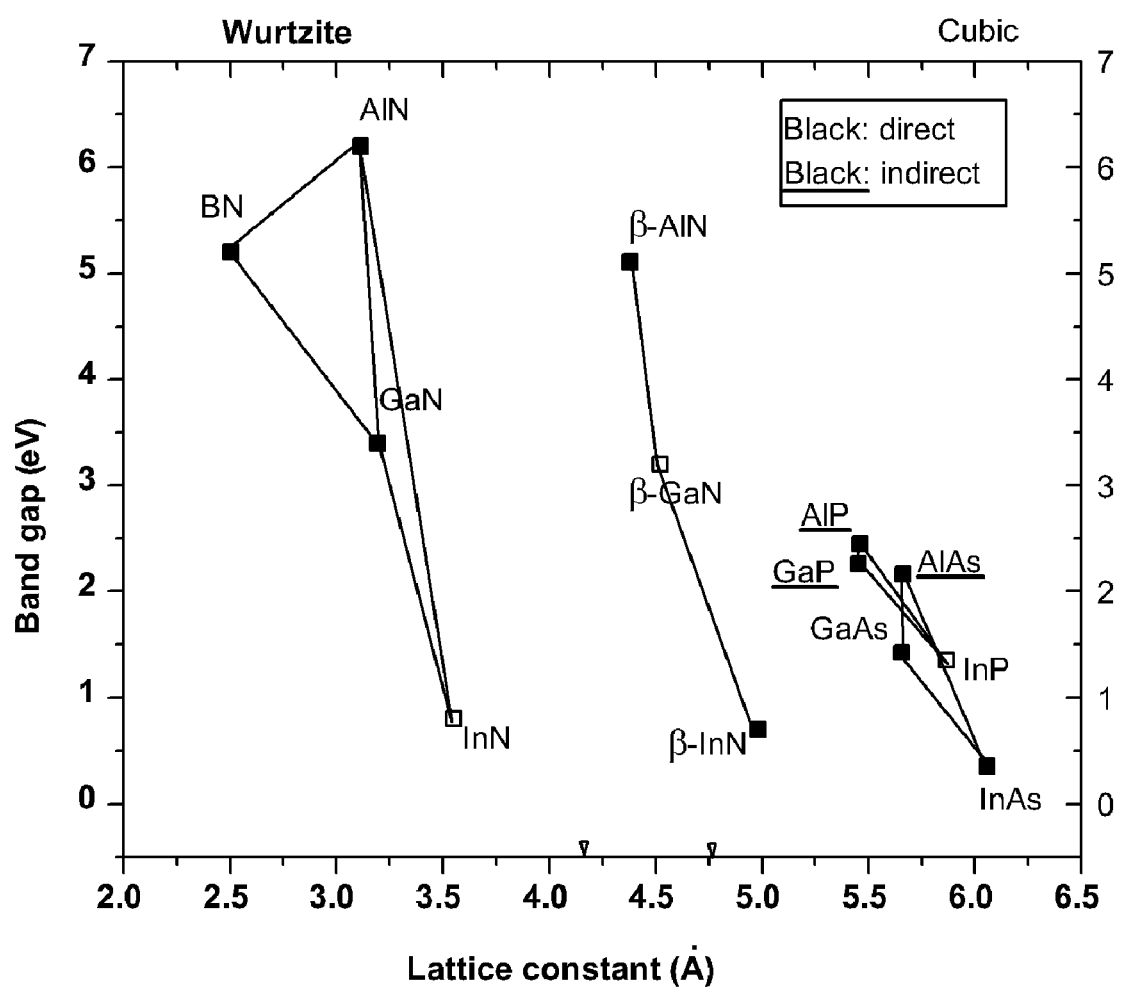
FIG. 4 is a graph showing lattice constants and bandgaps of materials used for a buffer layer.

FIG. 4 is a graph showing lattice constants and bandgaps of materials used for the buffer layer according to the embodiment.

Among materials as shown in FIG. 4, the buffer layer may comprise compound semiconductors obtained by combining III and V group elements with each other. For example, the buffer layer may comprise materials selected from the group consisting of GaN (comprises β-GaN), InN (comprises β-InN), AlN (comprises β-AlN), InGaN, AlGaN, InAlGaN and AlInN. The buffer layer may selectively use materials having a bandgap of 0.1 eV to 6.5 eV and a lattice constant of 2 Å to 6 Å. At this time, the buffer layer may have carrier concentration of $5 \times 10^{15}/cm^3$ to $3 \times 10^{21}/cm^3$ The buffer layer may have one of hexagonal, wurtzite, zincbland and cubic crystal line structures. When the buffer layer has crystalline structures different from each other, a lattice constant may be changed. In detail, physical and chemical properties, such as a thermal expansion coefficient due to change in the lattice constant and strain occurring between the thin film and the substrate, may be changed. Thus, the buffer layer may comprise one of the materials as shown in FIG. 4.

Figure 5:
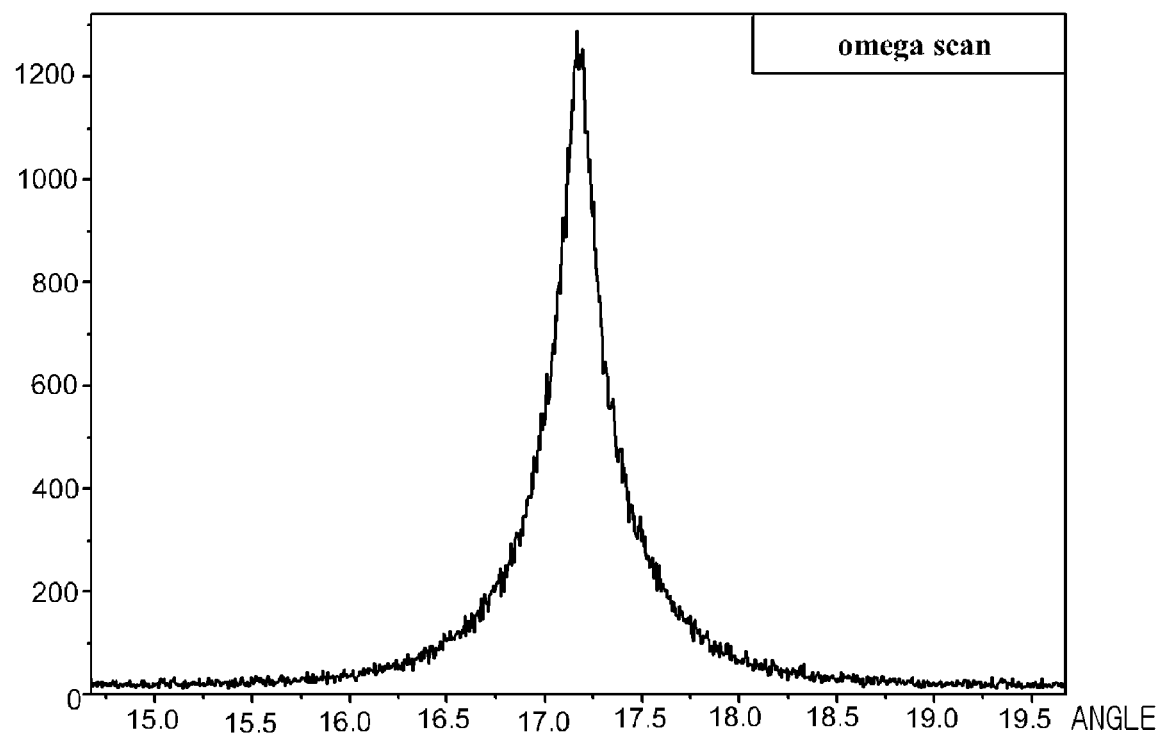
FIG. 5 is a graph showing a state obtained by scanning a GaN pattern using HD-XRD equipment in an omega scanning scheme according to an embodiment.

FIG. 5 is a graph obtained by analyzing angle and intensity of a GaN pattern using HD-XRD (high resolution x-ray diffraction) equipment in an omega scanning scheme according to the embodiment. According to the omega scanning scheme, half width at half maximum and crystallization of specific material with respect to a specific surface are measured and a scanning angle thereof is narrow.

FIG. 5 shows the angle and intensity of the GaN pattern (a sample of the buffer layer) measured using the HD-XRD equipment as crystalline analysis equipment. The semiconductor sample is the GaN pattern, and the maximum intensity is obtained when the GaN pattern has an angle of about 17.3°.

Referring to peak data of the GaN sample of the buffer layer measured using the HD-XRD equipment, the half width at half maximum of the XRD is narrower as the crystalline of the buffer layer is higher. In detail, as the intensity of the buffer layer is higher and the half width at half maximum of the buffer layer is narrower, the buffer layer has good crystalline.

Figure 6:
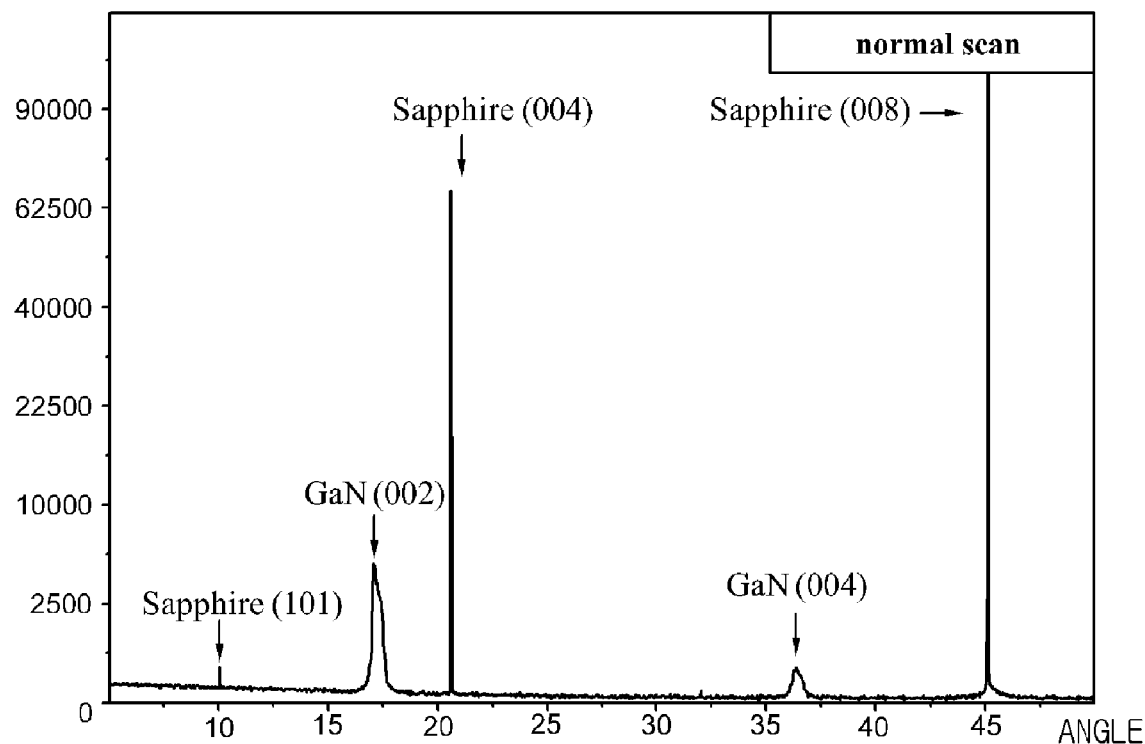
FIG. 6 is a graph showing a state obtained by scanning a sapphire and a GaN pattern using HD-XRD equipment in a normal omega scanning scheme according to an embodiment.

FIG. 6 is a graph obtained by scanning a sapphire and a CaN pattern using the HD-XRD equipment in a normal scanning scheme according to the embodiment. According to the normal scanning scheme, the directivity and crystalline of various materials are analyzed.

As shown in FIG. 6, a sapphire substrate has a plane index of 101 at an angle of about 10°, 004 at an angle of about 21°, and 008 at an angle of about 45°. The GaN buffer layer has a plane index of 002 at an angle of about 17° and 004 at an angle of about 36°.

Figure 7:
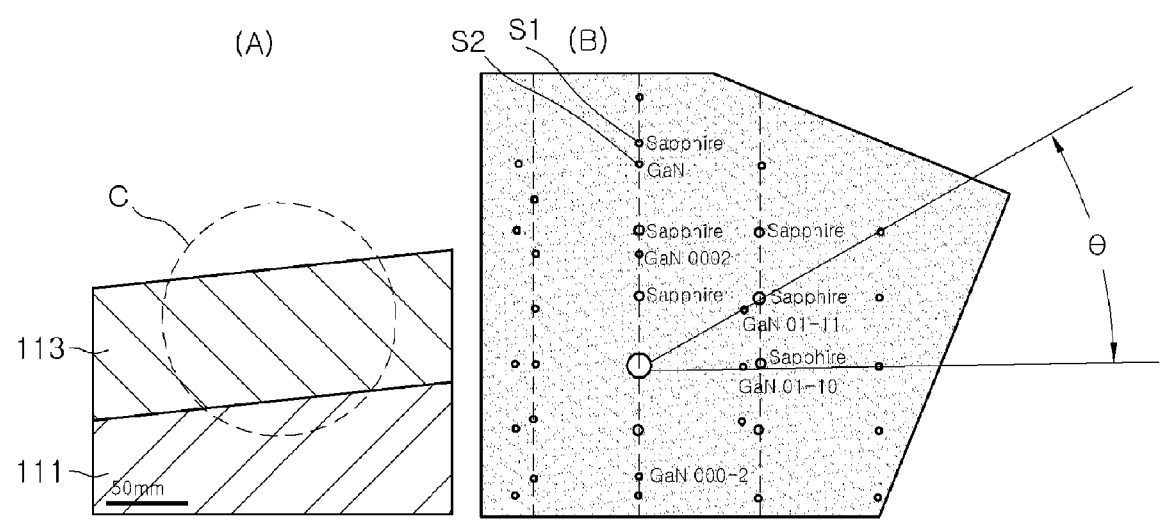
FIG. 7A is a view showing a substrate and a buffer layer on the substrate.
FIG. 7B is a view showing TEM SAD (transmission electron microscopy-selected area diffraction) data measured from a side of a buffer layer at the part C shown in FIG. 7A.

FIG. 7A is a view showing the substrate and the buffer layer on the substrate, and FIG. 7B is a view showing the crystalline of a crystalline structure of the part C shown in FIG. 7A, which is measured using a TEM-SAD (transmission electron microscopy-selected area diffraction) method according to the embodiment. According to the embodiment, FIG. 7B shows a spot pattern in the form of spots on the basis of a GaN part. As shown in FIG. 7B, spots S1 and S2 of the GaN buffer layer 113 and the substrate 111 are alternately shown.

Figure 8:
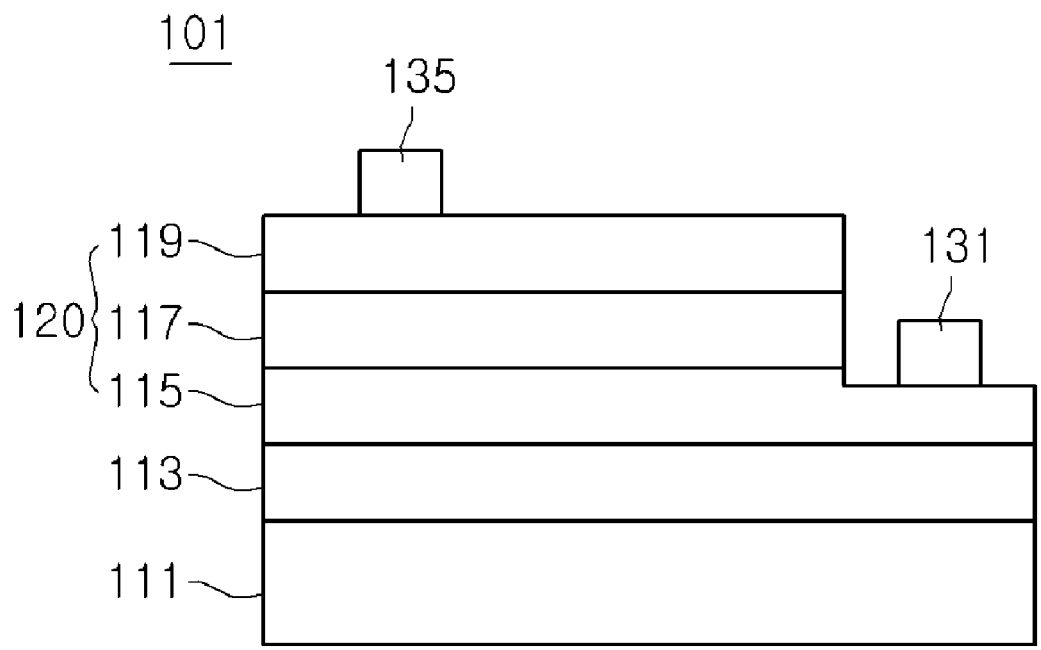
FIG. 8 is a side sectional view showing a lateral semiconductor light emitting device using the semiconductor light emitting device in FIG. 1.

FIG. 8 is a side sectional view showing a lateral semiconductor light emitting device using the semiconductor light emitting device in FIG. 1.

Referring to FIG. 8, in the lateral semiconductor light emitting device 101, the first conductive semiconductor layer 115 is partially exposed through a mesa etching process, a first electrode 131 is formed on the first conductive semiconductor layer 115, and a second electrode 135 having a predetermined pattern is formed on the second conductive semiconductor layer 119. When a transparent electrode layer is formed on the second conductive semiconductor layer 119, the second electrode 135 can be formed on the transparent electrode layer.

Figure 9:
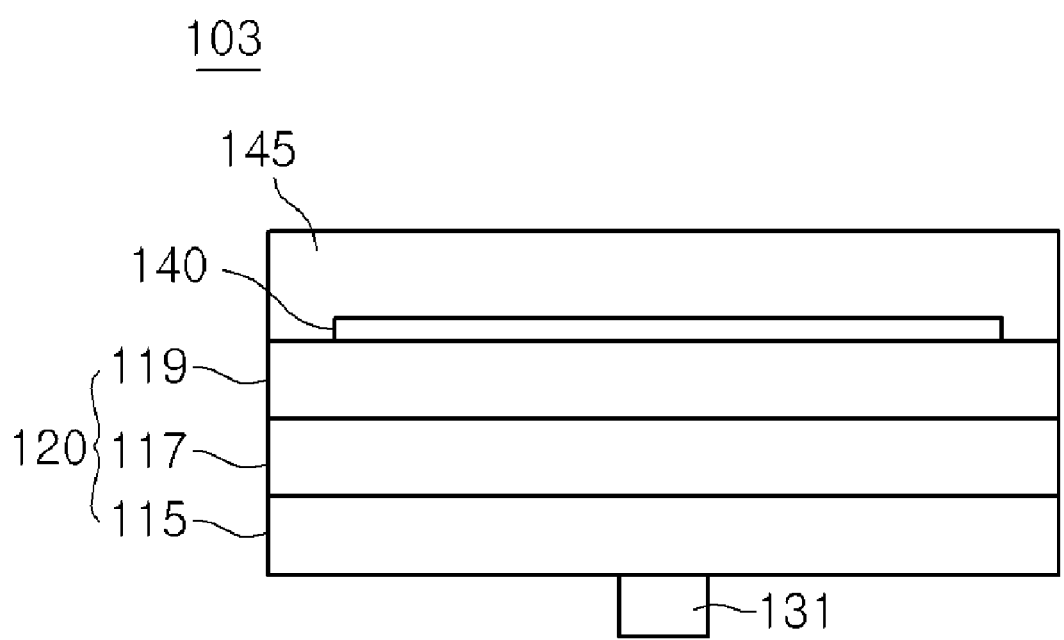
FIG. 9 is a side sectional view showing a vertical semiconductor light emitting device using the semiconductor light emitting device in FIG. 1.

FIG. 9 is a side sectional view showing a vertical semiconductor light emitting device using the semiconductor light emitting device in FIG. 1.

Referring to FIG. 9, in the vertical semiconductor light emitting device 103, an electrode layer 140 is formed on the second conductive semi conductor layer 119, and a conductive support member 145 is formed on the electrode layer 140. The electrode layer 140 can be formed in a single layer or multilayer structure by using at least one selected from the group consisting of Al, Ag, Pd, Rh and Pt. Further, an ohmic contact layer having a predetermined pattern can be formed between the electrode layer 140 and the second conductive semiconductor layer 119. The conductive support member 145 can be selectively formed using cupper, gold and wafer carrier (e.g. Si, Ge, GaAs, ZnO and SiC).

Then, the substrate 111 of FIG. 1 is removed using a physical scheme and/or a chemical scheme. According to the physical scheme, the substrate 111 is removed using an LLO (laser lift off) scheme of irradiating laser having predetermined wavelength onto the substrate 111. According to the chemical scheme, the substrate 111 is removed by injecting etchant solution into the buffer layer 113 of FIG. 1. Further, the first electrode 131 can be formed under the first conductive semiconductor layer 115.

Figure 10:
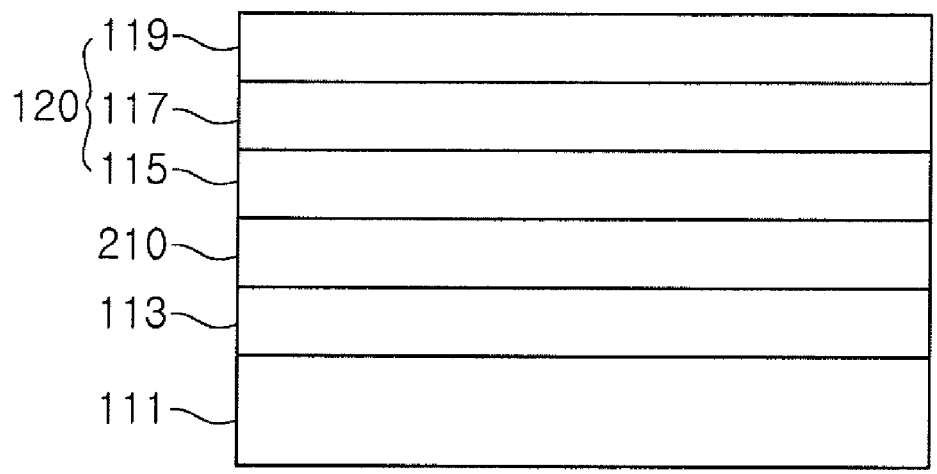
FIG. 10 is a side sectional view showing a semiconductor light emitting device according to another embodiment.
Figure 11:
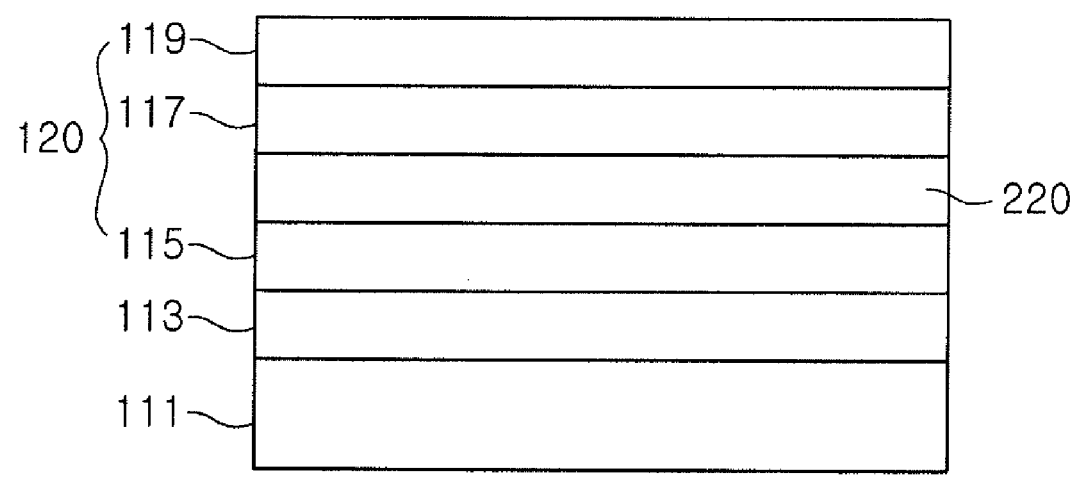
FIG. 11 is a side sectional view showing a semiconductor light emitting device according to another embodiment.

As show in FIGS. 10 and 11, buffer layer 210 or 220 is formed in a first conductive semiconductor layer 115. In other words, the buffer layer 210 can be formed under the first conductive semiconductor layer 115 as shown in FIG. 10, and the buffer layer 220 can be formed on the first conductive semiconductor layer 115 as shown in FIG. 11.

Figure 12:
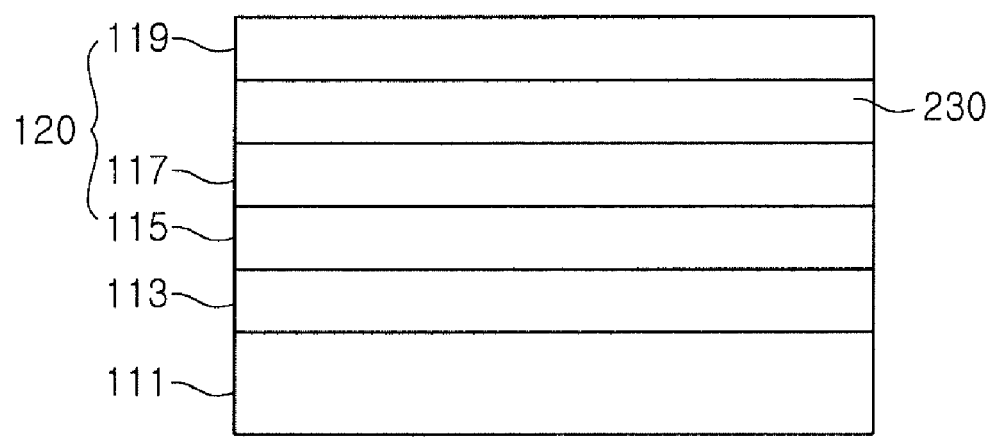
FIG. 12 is a side sectional view showing a semiconductor light emitting device according to another embodiment.
Figure 13:
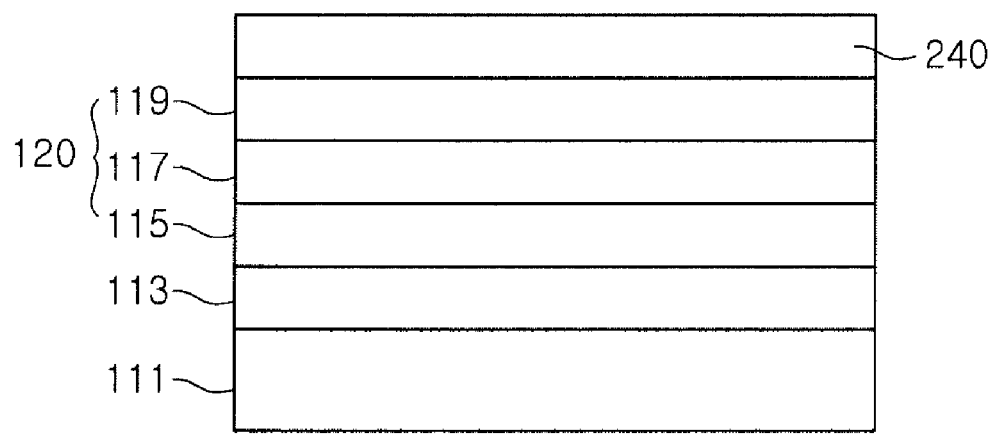
FIG. 13 is a side sectional view showing a semiconductor light emitting device according to another embodiment.

As shown in FIGS. 12 and 13, buffer layer 230 or 240 is formed in a second conductive semiconductor layer 119. In other words, the buffer layer 230 can be formed under the second conductive semiconductor layer 119 as shown in FIG. 12, and the buffer layer 240 can be formed on the second conductive semiconductor layer 119 as shown in FIG. 13.

The semiconductor light emitting device according to the embodiment can be formed with a P—N junction structure, an N—P junction structure, an N—P—N junction structure or a P—N—P junction structure Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure, More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a first single crystalline buffer layer; and
a compound semiconductor structure comprising a first conductive semiconductor layer on the first single crystalline buffer layer, an active layer on the first conductive semiconductor layer, a second conductive semiconductor layer on the active layer, and a second single crystalline buffer layer comprised in at least one of the first and second conductive semiconductor layers.

2. The semiconductor light emitting device as claimed in claim 1, wherein at least one of the first and second single crystalline buffer layers comprises a composition equation of $In_xAl_yGa_{1-x-y}N$ ($0 \leq x \leq 1$, $0 \leq y \leq 1$, $0 \leq x+y \leq 1$).

3. The semiconductor light emitting device as claimed in claim 1, wherein the compound semiconductor structure further comprises an undoped semiconductor layer on the first single crystalline buffer layer.

4. The semiconductor light emitting device as claimed in claim 1, comprising a substrate under the first single crystalline buffer layer.

5. The semiconductor light emitting device as claimed in claim 1, wherein each of the first and second single crystalline buffer layers comprise at least one selected from the group consisting of GaN, β-GaN, InN, β-InN, AlN, β-AlN, InGaN, AlGaN, InAlGaN and AlInN.

6. The semiconductor light emitting device as claimed in claim 1, wherein each of the first and second single crystalline buffer layers comprises a conductive dopant.

7. The semiconductor light emitting device as claimed in claim 1, wherein each of the first and second crystalline buffer layers has a carrier concentration of $5 \times 10^{15}/cm^3$ to $3 \times 10^{21}/cm^3$.

8. The semiconductor light emitting device as claimed in claim 1, wherein each of the first and second crystalline buffer layers has a lattice constant of 2 Å to 6 Å.

9. The semiconductor light emitting device as claimed in claim 1, wherein each of the first and single crystalline buffer layers has a thickness of 500 Å to 10000 Å.

10. The semiconductor light emitting device as claimed in claim 1, wherein at least one of the first and second single crystalline buffer layers comprises one of hexagonal, wurtzite, zincbland and cubic crystalline structures, and is formed in a multilayer structure.

11. The semiconductor light emitting device as claimed in claim 10, wherein the multilayer structures of at least one of the first and second single crystalline buffer layers comprise crystalline structures different from each other.

* * * * *